United States Patent
Wertz et al.

(10) Patent No.: US 9,188,617 B2
(45) Date of Patent: Nov. 17, 2015

(54) USING A SHARED LOCAL OSCILLATOR TO MAKE LOW-NOISE VECTOR MEASUREMENTS

(71) Applicant: National Instruments Corporation, Austin, TX (US)

(72) Inventors: Daniel S. Wertz, Sebastopol, CA (US); Michael J. Seibel, Santa Rosa, CA (US)

(73) Assignee: National Instruments Corporation, Austin, TX (US)

( * ) Notice: Subject to any disclaimer, the term of this patent is extended or adjusted under 35 U.S.C. 154(b) by 407 days.

(21) Appl. No.: 13/862,986

(22) Filed: Apr. 15, 2013

(65) Prior Publication Data

US 2014/0306720 A1    Oct. 16, 2014

(51) Int. Cl.
| | |
|---|---|
| G01R 29/26 | (2006.01) |
| G01R 27/28 | (2006.01) |
| G01R 27/32 | (2006.01) |
| G01R 31/26 | (2014.01) |
| G01R 19/00 | (2006.01) |
| G01R 23/20 | (2006.01) |

(52) U.S. Cl.
CPC ............ *G01R 27/32* (2013.01); *G01R 19/0053* (2013.01); *G01R 29/26* (2013.01); *G01R 31/2616* (2013.01); *G01R 31/2626* (2013.01); *G01R 31/2646* (2013.01); *G01R 23/20* (2013.01)

(58) Field of Classification Search
CPC ........ G01R 27/32; G01R 27/02; G01R 27/26; G01R 27/28; G01R 23/00; G01R 23/16; G01R 23/20; G01R 29/26; G01R 19/0053; G01R 19/0084; G01R 19/0092; G01R 31/2616; G01R 31/2626; G01R 31/2646; G01R 31/31709

USPC ............. 324/613, 612, 300, 650, 649, 76.11, 324/76.12, 76.19, 76.22

See application file for complete search history.

(56) References Cited

U.S. PATENT DOCUMENTS

| | | | |
|---|---|---|---|
| 6,348,804 B1 | 2/2002 | Evers | |
| 6,529,844 B1 | 3/2003 | Kapetanic et al. | |
| 6,549,862 B1 | 4/2003 | Huang et al. | |
| 7,248,033 B2 | 7/2007 | Anderson et al. | |
| 7,409,617 B2 * | 8/2008 | Almy et al. .................. | 714/738 |
| 7,518,353 B2 | 4/2009 | Tanbakuchi et al. | |
| 7,545,150 B2 | 6/2009 | Anderson et al. | |
| 7,683,633 B2 | 3/2010 | Noujeim | |
| 7,706,250 B2 | 4/2010 | Olgaard et al. | |
| 8,155,904 B2 | 4/2012 | Dvorak et al. | |
| 8,224,269 B2 | 7/2012 | Jungerman et al. | |
| 8,841,923 B1 * | 9/2014 | Vanwiggeren ................ | 324/606 |
| 2001/0037189 A1 * | 11/2001 | Onu et al. ..................... | 702/191 |
| 2009/0061812 A1 * | 3/2009 | VanWiggeren et al. ....... | 455/326 |

* cited by examiner

*Primary Examiner* — Hoai-An D Nguyen
(74) *Attorney, Agent, or Firm* — Meyertons Hood Kivlin Kowert & Goetzel, P.C.; Jeffrey C. Hood

(57) ABSTRACT

Measurements, e.g. S-parameter measurements may be performed by obtaining a complex ratio of at least two signals, using a single signal-receiver while eliminating noise problems traditionally associated with single receiver systems. A Vector Signal Generator (VSG) may be used to generate the input stimulus (signal), making it possible to share the local oscillator (LO) signal of the VSG with a single vector receiver, such that the phase noise of the LO signal is common to both the VSG and the vector receiver. When the stimulus signal from the VSG is observed with the vector receiver, the LO phase noise is unobservable, resulting in a significant reduction of the phase noise in the measured signals in both the numerator and the denominator, which in turn leads to a significant reduction in the phase noise of the ratio while retaining the benefits of a simple, single receiver.

21 Claims, 5 Drawing Sheets

USING A SHARED LOCAL OSCILLATOR TO MAKE LOW-NOISE VECTOR MEASUREMENTS

FIELD OF THE INVENTION

The present invention relates to the field of instrumentation, and more particularly to making low-noise vector measurements.

DESCRIPTION OF THE RELATED ART

In many industrial applications (and others), instruments collect data or information from an environment or unit under test (UUT), and may also analyze and process acquired data. Some instruments provide test stimuli to a UUT. Examples of instruments include oscilloscopes, digital multimeters, pressure sensors, arbitrary waveform generators, digital waveform generators, etc. The information that may be collected by respective instruments includes information describing voltage, resistance, distance, velocity, pressure, oscillation frequency, humidity, and/or temperature, among others. Computer-based instrumentation systems typically include transducers for capturing a physical phenomenon and generating a representative electrical signal, signal conditioning logic to perform amplification on the electrical signal, isolation, and/or filtering, and analog-to-digital (A/D) conversion logic for receiving analog signals and providing corresponding digital signals to the host computer system.

In a computer-based system, the instrumentation hardware or device is typically an expansion board plugged into one of the I/O slots of the computer system. In another common instrumentation system configuration, the instrumentation hardware is coupled to the computer system via other means such as through a VXI (VME extensions for Instrumentation) bus, a GPIB (General Purpose Interface Bus), a PXI (PCI extensions for Instrumentation) bus, Ethernet, a serial port or bus, or parallel port of the computer system. The instrumentation hardware may include a DAQ (Data Acquisition) board, a computer-based instrument such as a multimeter, or another type of instrumentation device. In another common system configuration, a chassis and boards inserted in the chassis may operate as a standalone instrument or instrument suite, although in some cases a host computer may be used to configure or program the boards prior to, or during operation.

The instrumentation hardware may be configured and controlled by software executing on a host computer system coupled to the system, or by a controller card installed in the chassis. The software for configuring and controlling the instrumentation system typically includes driver software and the instrumentation application software, or the application. The driver software serves to interface the instrumentation hardware to the application and is typically supplied by the manufacturer of the instrumentation hardware or by a third party software vendor. The application is typically developed by the user of the instrumentation system and is tailored to the particular function that the user intends the instrumentation system to perform. The instrumentation hardware manufacturer or third party software vendor sometimes supplies application software for applications that are common, generic, or straightforward. Instrumentation driver software provides a high-level interface to the operations of the instrumentation device. The instrumentation driver software may operate to configure the instrumentation device for communication with the host system and to initialize hardware and software to a known state. The instrumentation driver software may also maintain a soft copy of the state of the instrument and initiated operations. Further, the instrumentation driver software communicates over the bus to move the device from state to state and to respond to device requests.

One widely used instrumentation device, for example, is a Vector Network Analyzer (VNA), which is useful in many applications that require electrical and/or microwave measurements, such as transmission and reflection properties. VNAs are usually used where the electrical signals have a high frequency, e.g. from 10 kHz to 100 GHz. Since a VNA can be used to measure complex impedances of circuits at high frequencies, VNAs are used in many electronic and radio frequency (RF) laboratories, as well as in chip/microwave device or system manufacturing facilities. A VNA can apply a stimulus signal (e.g. a sine wave) to a device under test (DUT) and perform a series of measurements and calculations. A two-port VNA can measure both reflected signals from the DUT and transmitted signals through the DUT. Additionally, the VNA can calculate S-parameters and other related parameters for that DUT. S-parameters, or scattering parameters describe the electrical behavior of linear electrical networks in response to various steady state input signals. Many electrical properties of networked components such as inductors, capacitors, resistors may be expressed using S-parameters such as gain, return loss, voltage standing wave ratio (VSWR), reflection coefficient, amplifier stability, etc. The VNA can perform repeated measurements using different frequencies and/or power levels to measure the desired characteristics of the DUT.

When making S-parameter measurements, it is necessary to obtain a complex ratio of two signals, which requires measuring the magnitude and phase of the two signals with great accuracy, stability, repeatability and dynamic range. Such measurements are typically performed using a stimulus source, two (or more) vector signal receivers, and signal separation devices such as couplers or bridges, which are typically used to separate forward and reverse waves so that the incident, reflected, and transmitted signals can be individually measured. The multiple receivers are used to simultaneously measure the signals of interest, and the ratios are directly calculated from the measured, complex values. One benefit of this traditional method is the elimination of any magnitude and phase jitter that may be present on the stimulus signals, as any such jitter appears simultaneously at the two receivers and is therefore effectively canceled when obtaining the ratio of the two signals. Another class of VNA makes use of a single receiver that is switched between the desired signals of interest. This configuration has significant system advantages related to simplification, tracking, power, cost, and size. However, with a single receiver, the benefit of noise cancellation provided by the use of multiple receivers is traditionally lost. Noise appearing on the stimulus signal also appears on all the measurement channels. Since the channels are not measured at the same time, the measured noise becomes decorrelated, and the ratio therefore retains the full effect of the stimulus noise.

Other corresponding issues related to the prior art will become apparent to one skilled in the art after comparing such prior art with the present invention as described herein.

SUMMARY OF THE INVENTION

In one set of embodiments, measurements, e.g. S-parameter measurements may be performed by obtaining a complex ratio of at least two signals, using a single signal receiver while eliminating noise problems traditionally associated with single-receiver systems. A Vector Signal Generator (VSG) may be used to generate the input stimulus (signal), making it possible to share the local oscillator (LO) signal of the VSG with a single vector receiver (e.g. in a spectrum analyzer—SA), such that the phase noise of the LO signal is common to both the VSG and the vector receiver. When the stimulus signal from the VSG, or a signal based on the stimulus signal, for example as modified by a device under test, is observed with the vector receiver, the LO phase noise is unobservable, resulting in a significant reduction of the phase noise in the measured signals in both the numerator and the denominator, which in turn leads to a significant reduction in the jitter or deviation of the ratio while retaining the benefits of a simple, single receiver.

Accordingly, a VSG that includes a synthesized, high frequency LO and an I/Q quadrature modulator (QM) may be used to provide the stimulus signal for a vector network analyzer (VNA). The same LO signal may be used as the local oscillator for a single, I/Q down-converter receiver in a spectrum analyzer. By using the same LO signal in both the QM and the single receiver, the phase noise of the high frequency LO is imposed on both the stimulus signal, and the down-converting receiver, providing near perfect cancellation of the effects of the phase noise. That is, the effect of the phase noise may be reduced to have no more than a negligible impact on performance and accuracy. Since phase noise is a dominating portion of the measurement noise, particularly at high power, during a VNA measurement (including single-channel measurement), this provides significant improvement in performance and accuracy.

The use of a shared LO signal facilitates a far more effective measurement method than the common method of using a phase-locked reference or time-base (typically 10 MHz or 100 MHz). In case of the phase-locked reference, the stimulus signal and the receiver utilize separate LOs that are locked to the same time-base, providing accurate frequency settings and phase noise coherency within the bandwidths of the phase-locked loops. Since these phase-locked loops are typically very low bandwidth (often <100 Hz), most of the measurement bandwidth is uncorrelated, which results in large deviations while making ratioed measurements. Reducing the noise during a single-channel vector measurement may be achieved by reducing the measurement bandwidth, which effectively results in taking more averages of the noisy data, requiring more measurement time, and slowing down the throughput of a test system. Use of a shared LO significantly reduces the noise with no change in the size of the received data, and without required changes in the measurement bandwidth. The noise reduction makes it possible to either make a ratio measurement at a greatly reduced variance (compared to a traditional single-receiver), or reduce the amount of sampled data and perform the measurement at a much greater speed.

Therefore, a measurement system may be designed to include a local oscillator to generate a periodic signal, which is received by a signal generator and a receiver both included in the measurement system. The signal generator may generate a stimulus signal based on the received periodic signal, and the measurement system may output a test signal based on the stimulus signal at a test port. The receiver may be operated to alternately receive as an input signal a first coupled signal derived from the stimulus signal, and a second coupled signal derived from the stimulus signal, and generate an output signal based on the received input signal according to the periodic signal. The first coupled signal may be representative of power incident on the test port, and the second coupled signal may be representative of power reflected on the test port. Accordingly, measurements may be made for any one or more of the input port voltage reflection coefficient, the reverse voltage gain, the forward voltage gain, and the output port voltage reflection coefficient.

The measurement system may also include a switching element with a first input receiving the first coupled signal, a second input receiving the second coupled signal, and an output coupling to an input of the receiver. The switching element may controllably alternate between providing the first coupled signal to the input of the receiver and providing the second coupled signal to the input of the receiver through its output. In some embodiments, the receiver is an I/Q down converter receiver, and the signal generator includes a QM receiving a pair of modulator input signals and the periodic signal, and generating the stimulus signal based on the pair of modulator input signals and the periodic signal. The QM may also be used to provide the offset needed for an intermediate frequency.

The measurement system may further include an analog-to-digital converter (ADC) coupled to an output of the receiver to produce respective numeric values corresponding to the first output signal and the second output signal according to the output signal provided at the output of the receiver. In one embodiment, the measurement system includes a first and a second directional coupler, with the first directional coupler receiving the stimulus signal, coupling a portion of a forward wave associated with the stimulus signal as the first signal, and transmitting the stimulus signal to the second directional coupler. The second directional coupler in turn receives the stimulus signal transmitted by the first directional coupler, couples a portion of a reverse wave associated with the stimulus signal as the second signal, and transmits the stimulus signal as the test signal to the test port.

Based on a physical LO signal shared by a source and a receiver, a method for measuring parameters of a device under test (DUT) may include generating a periodic signal, providing the periodic signal to a QM and to a down converter receiver, generating a stimulus signal using the QM operating according to the periodic signal, deriving a first coupled signal and a second coupled signal from the stimulus signal, alternately providing the first coupled signal and the second coupled signal to the down converter receiver, generating a first measurement value based on the first coupled signal using the down converter receiver operating according to the periodic signal, and generating a second measurement value based on the second coupled signal using the down converter receiver operating according to the periodic signal.

The first coupled signal may be derived by coupling at least a portion of a forward wave associated with the stimulus signal, while the second coupled signal may be derived by coupling at least a portion of a reverse wave associated with the stimulus signal. The method may also include providing the stimulus signal to a DUT through a test port, and determining a parameter of the DUT by dividing the second measurement value with the first measurement value. In this case, the first coupled signal is representative of incident power on the test port, and the second coupled signal is representative of reflected power on the test port. Again, measurements may be made for any one or more of the input port voltage reflection coefficient, the reverse voltage gain, the forward voltage gain, and the output port voltage reflection coefficient.

Other aspects of the present invention will become apparent with reference to the drawings and detailed description of the drawings that follow.

BRIEF DESCRIPTION OF THE DRAWINGS

A better understanding of the present invention can be obtained when the following detailed description of the preferred embodiment is considered in conjunction with the following drawings, in which.

Figure 1:
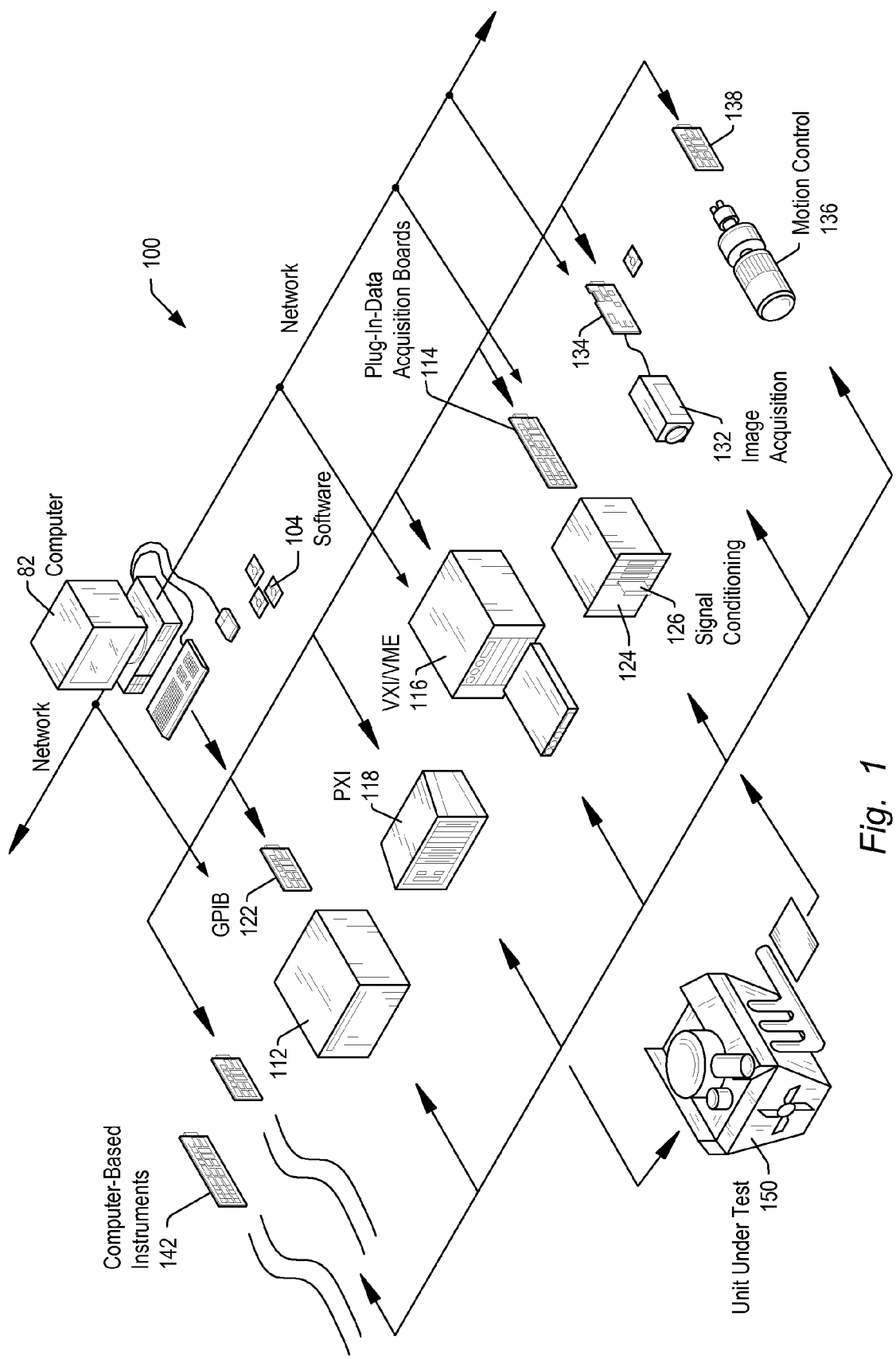
FIG. 1 shows an instrumentation control system with instruments networked together according to one embodiment of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

It is noted that the various terms or designations for circuits/components and signals as they appear herein, for example in such expressions as "switching circuit", "delay circuit", "source signal", "stimulus signal", etc. are merely names or identifiers used to distinguish among the different circuits/components and/or between different signals, and these terms are not intended to connote any specific meaning, unless directly indicated otherwise.

Embodiments of the present invention may be used in systems configured to perform test and/or measurement functions, to control and/or model instrumentation or industrial automation hardware, or to model and simulate functions, e.g., modeling or simulating a device or product being developed or tested, etc. More specifically, it may be used in various instances where input protection for instrumentation equipment is required, without degrading the performance of the protected instrumentation equipment. However, it is noted that the present invention may equally be used for a variety of applications, and is not limited to the applications enumerated above. In other words, applications discussed in the present description are exemplary only, and the present invention may be used in any of various types of systems. Thus, the system and method of the present invention may be used in any number of different applications. It is noted that the various terms or designations for circuits/components as they appear herein, such as "feedback circuit", "measurement circuit", etc. are merely names or identifiers used to distinguish among the different circuits/components, and these terms are not intended to connote any specific, narrowly construed meaning.

FIG. 1 illustrates an exemplary instrumentation control system 100 which may be configured according to embodiments of the present invention. System 100 comprises a host computer 82 which may couple to one or more instruments configured to perform a variety of functions using timing control implemented according to various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices.

The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
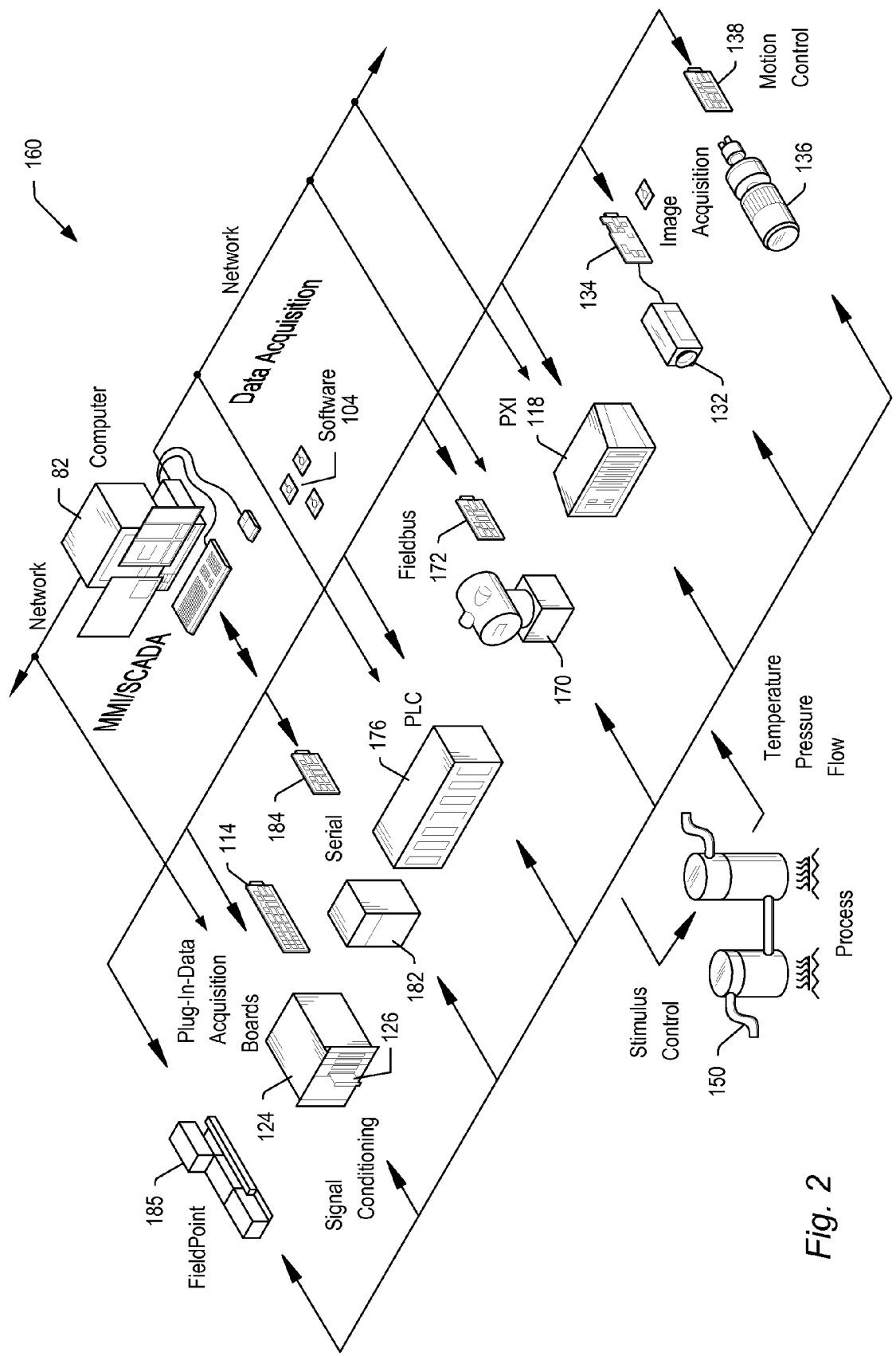
FIG. 2 shows an industrial automation system with instruments networked together according to one embodiment of the invention.

FIG. 2 illustrates an exemplary industrial automation system 160 that may include embodiments of the present invention. Industrial automation system 160 may be similar to instrumentation or test and measurement system 100 shown in FIG. 2A. It should be noted that both systems 100 and 160 are merely shown as examples, and various embodiments of a shared oscillator configuration described herein may be used in a variety of other instrumentation or test configurations. Elements that are similar or identical to elements in FIG. 1 have the same reference numerals for convenience. System 160 may comprise a computer 82 which may couple to one or more devices and/or instruments configured to perform a variety of functions using timing control implemented according to various embodiments of the present invention. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection.

Figure 3:
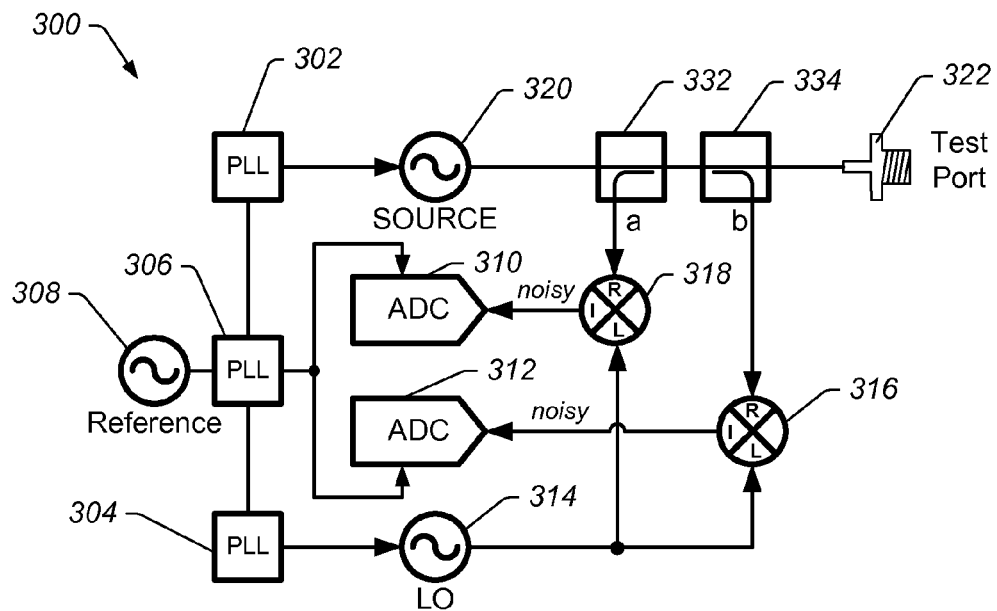
FIG. 3 shows a simplified block diagram of a traditional vector network analyzer, according to prior art.

In some embodiments, measurement or measuring instruments and devices, such as those shown in FIG. 1, may include a vector signal generator (VSG) and/or vector network analyzer (VNA). The simplified block diagram featuring the components of interest of a traditional VNA 300 is shown in FIG. 3. A reference signal generator 308 provides a periodic (clock) signal to phase-locked loops (PLLs) 302, 304, and 306. PLL 302 is used by source signal generator 320 to generate the test signal to be output at test port 322, which may be coupled to a device under test (DUT; not shown) for which testing may be performed. The signal provided by source 320 to test port 322 is transmitted through two separate directional couplers, directional coupler 332 and directional coupler 334 as shown, where 'a' and 'b' represent respective coupled ports of directional couplers 332 and 334. Accordingly, signal 'a' represents a coupled signal output by directional coupler 332, and signal 'b' represents a coupled signal output by directional coupler 334. As configured in system 300, signal 'a' corresponds to a measure of the energy transmitted from test port 322, and signal 'b' corresponds to a measure of the energy entering test port 322 from outside system 300. Thus, the ratio 'b'/'a' provides a measure of the amount of energy reflected back from a DUT (to which test port 322 may be coupled) relative to the energy incident on test port 322, and is referred to as the voltage reflection coefficient. In other words, signal 'a' provides a measure of the incident power on test port 322, and signal 'b' provides a measure of the reflected power on test port 322. It should also be noted that as used herein, the expressions 'voltage reflection coefficient', 'energy reflection coefficient', and 'power reflection coefficient' are used interchangeably.

In one set of embodiments, system 300 may be designed such that signals 'a' and 'b' have small values compared with the actual incident and reflected power, respectively. This may be achieved by choosing the appropriate or desired (small) coupling factor, e.g. a coupling factor of −15 dB or −20 dB for each of directional couplers 332 and 334. It should also be noted that the inclusion and configuration of directional couplers 332 and 334 represents one possible way to obtain signals representative of the measured incident and reflected power on test port 322. In the configuration shown in FIG. 3, directional couplers 332 and 334 are coupled in series. Two identical directional couplers may be used, with one of the directional couplers reverse coupled. That is, directional coupler 332 may be connected to couple the forward wave, that is, it may be connected to obtain signal 'a' representative of the power incident on, or leaving test port 322. Conversely, directional coupler 334 may be reverse connected to couple the reverse wave, that is, it may be connected to obtain signal 'b' representative of the power reflected on, or entering test port 322. It should be noted that there are dual directional couplers that provide the functionality of couplers 332 and 334 in a single device, and a directional bridge may also be used to perform the same function. Overall, one skilled in the art will appreciate the different ways in which signals 'a' and 'b', as defined above, may be obtained based on the source signal coupled to test port 322.

PLL 304 provides a periodic signal from which a local oscillator (LO) 314 generates the local oscillator signal for receivers 316 and 318. The respective outputs from receivers 316 and 318 are provided to analog-to-digital converters (ADCs) 310 and 312, from which the digitized signal information may be made available, for example to a digital signal processing (DSP) unit (not shown). The phase noise from source 320 and LO 314 are correlated within the PLL bandwidth, which is usually very narrow (<1 kHz). A significant portion of the total phase noise energy is beyond that frequency range, and is uncorrelated. The individual phase measurements for 'a' and 'b' are noisy (indicated at the respective outputs of receivers 316 and 318), since they contain the sum of the uncorrelated phase noise from LO 314 and source 320. However the sum of this phase noise will be correlated between 'a' and 'b' since the two measurements were taken synchronously, therefore the noise effectively cancels when the ratio of 'b'/'a' is obtained. The result is a cancellation of the phase noise originating from LO 314 and source 320, when measuring the ratio of the signals 'b' and 'a'.

Figure 4:
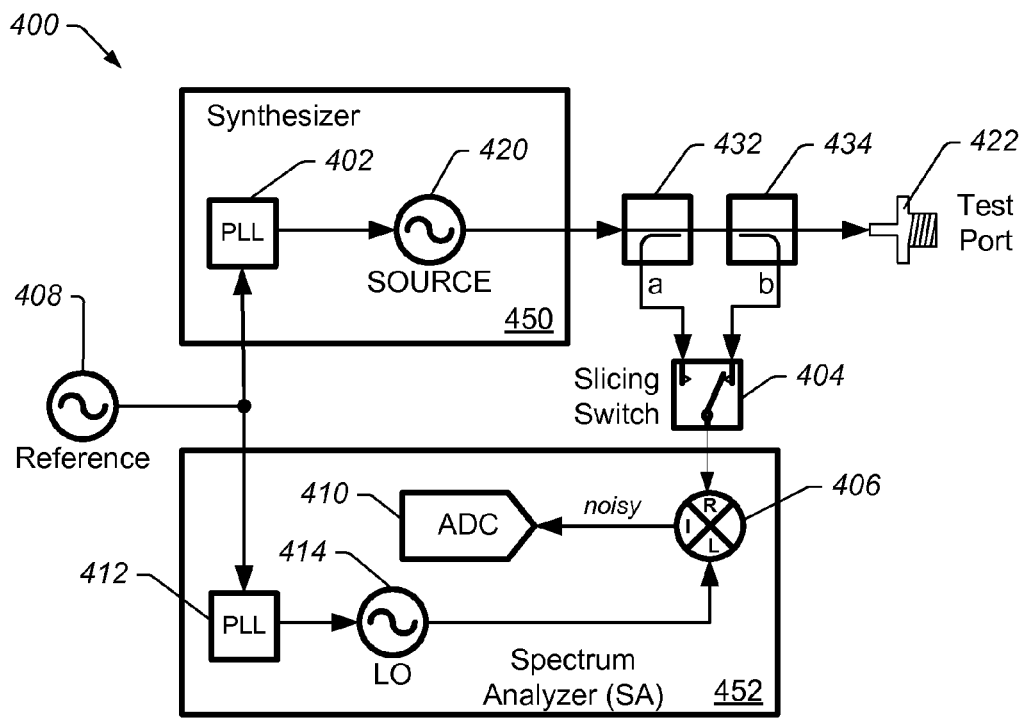
FIG. 4 shows a simplified block diagram of a traditional vector network analyzer that utilizes a single receiver, according to prior art.

The simplified block diagram featuring the components of interest of a traditional VNA 400 utilizing a single receiver is shown in FIG. 4. While VNA 400 is similar to VNA 300, in this case a synthesizer 450 is used to generate the test signal through a PLL 402 and signal source 420. A spectrum analyzer (SA) 452 includes a single receiver 406 receiving either signal 'a' or signal 'b' depending on the position of slicing switch 404. Signals 'a' and 'b' are generated through directional couplers 432 and 434, respectively, in a manner similar to how signals 'a' and 'b' are generated in system 300. A reference signal generator 408 provides the periodic control signal to PLL 402, as well as PLL 412 in SA 452, which also includes LO 414 and an ADC 410 to obtain a digitized version of the receiver output for further processing/analyzing. The phase noise from source 420 and the phase noise from LO 414 are correlated within the PLL bandwidth (similar to VNA 300), which, again is usually very narrow (<1 kHz). A significant portion of the total phase noise energy is uncorrelated and beyond that frequency range. The individual phase measurements for signal 'a' and signal 'b' are noisy, since they contain the sum of the uncorrelated phase noise from LO 414 and source 420. Since signals 'a' and 'b' are measured at different times, the total noise in one signal remains uncorrelated to the total noise in the other signal, and as a result there is no significant noise cancellation during the division of 'b' by 'a' (i.e. when obtaining 'b'/'a'). This results in a noisier ratio measurement of 'b'/'a', which has to be corrected by performing more averaging, or using a smaller intermediate frequency (IF) bandwidth, all of which typically result in a slower measurement.

Figure 5:
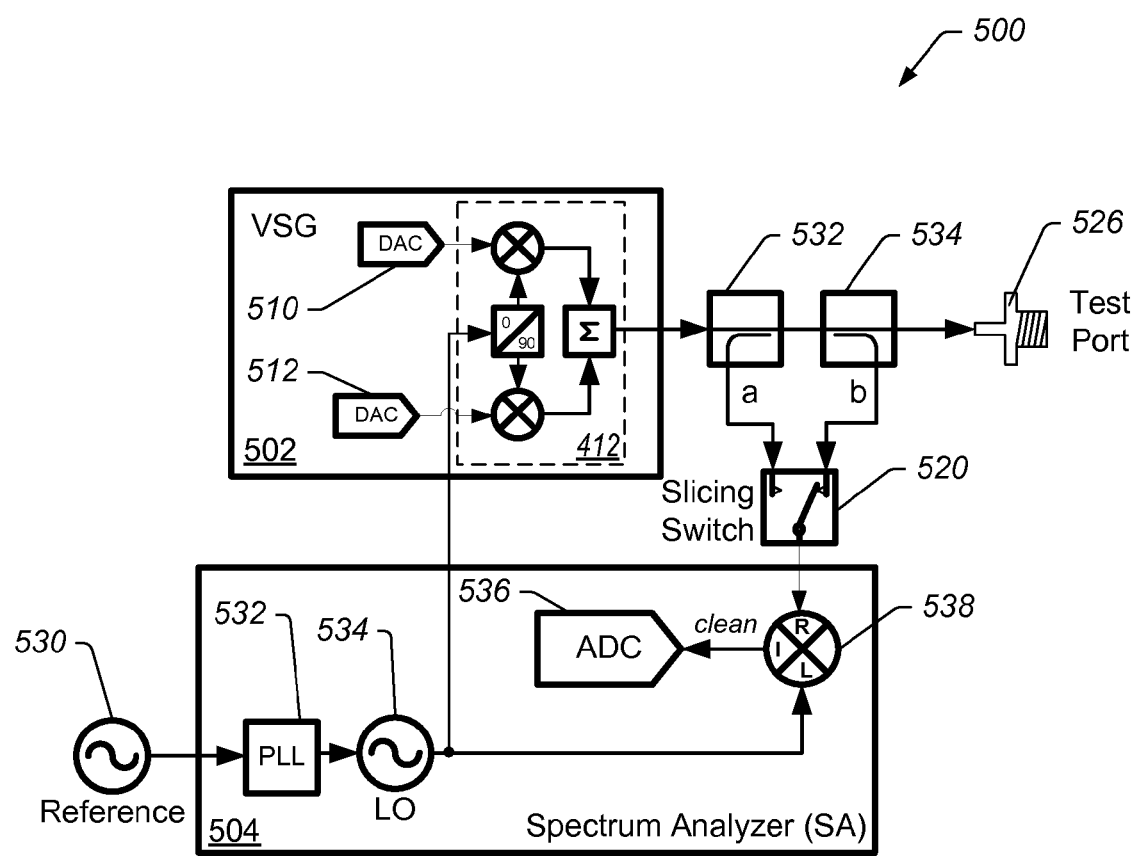
FIG. 5 shows a simplified block diagram of one embodiment of a novel vector network analyzer in which a single receiver and a vector signal generator share a common physical local oscillator signal.

In order to overcome the lack of noise cancellation when using a single receiver, a VNA may be designed to use a single local oscillator for both the source signal and the receiver. FIG. 5 shows the simplified block diagram featuring the components of interest of a VNA 500 that utilizes a single receiver 538 and a vector signal generator (VSG) 502 sharing a common LO 534. In one set of embodiments, the capability of using a single LO for both a single receiver and VSG may be provided by a Vector Signal Transceiver (VST) implementation, which combines a vector signal analyzer (VSA) and VSG with a user-programmable FPGA for real-time signal processing and control. That is, VNA 500 may be implemented as a VST. Accordingly, VSG 502 or SA 504 may include a synthesized, high frequency LO. Furthermore, an I/Q modulator, or quadrature modulator (QM) may be used to provide the stimulus signal for VNA 500. In FIG. 5, the synthesized, high frequency LO 534 is generated through the use of PLL 532 from a reference 530 signal, with PLL 532 and LO 534 both included in SA 504. In alternate embodiments, VSG 502 may include circuitry to generate the LO signal provided to both the VSG and the single receiver. In general, the circuitry to generate the LO signal may be placed where desired, so long as the same LO signal is provided to both the VSG and the receiver.

Accordingly, in addition to providing the LO 534 signal to receiver 538, SA 504 is also used to provide the LO 534 signal to QM 412, which then generates the stimulus signal from inputs received from DAC 510 and DAC 512, respectively. The stimulus signal is provided to VNA test port 526, which, again, may be coupled to a corresponding test port on a DUT (not shown) on which the testing may be performed. Similar to systems 300 and 400, signals 'a' and 'b' may be coupled off through directional couplers 532 and 534, respectively. Furthermore, similar to system 400, signals 'a' and 'b' may be alternately provided to receiver 538 in SA 504 through the use of switch 520. It should be noted, however, that while FIG. 5 shows two couplers, alternate embodiments might have more than two couplers, configured to couple any desired version of the signal, and switch 520 may be configured to selectively (controllably) provide any one of the multiple number of coupled signals to SA 504, one signal at a time. QM 412 in VSG 502 may also be used to provide the offset for an intermediate frequency (IF). Because LO 534 is the same physical signal for both VSG 502 and receiver 538 (which is included in SA 504), the LO phase noise is also the same for both VSG 502 and receiver 538. The individual phase measurements for signals 'a' and 'b' are largely free from the effects of source and LO phase noise, since the source and LO phase noise are correlated for all frequency offsets by virtue of the source being based on the same LO signal (in contrast, in both systems 300 and 400 the source represented a periodic signal distinct and different from the LO). Thus, prior to performing the ratio of 'b'/'a', both operands are "clean", and no cancellation is required to achieve a clean ratio. The result is a clean ratio using the simpler architecture of a single-receiver system.

The output from receiver 538, which may be an I/Q down-converter receiver, is provided to ADC 536 to generate the digital output for further processing and/or analysis (by either a DSP or other component, not shown, either outside or inside VNA 500). By providing the same LO signal to the single I/Q down-converter receiver 538 and to QM 412, which is used in providing the stimulus signal for the VNA, the phase noise of the high frequency LO 534 is imposed on both the stimulus signal and the down-converting receiver, providing near-perfect cancellation of the effects of the phase noise. In other words, the effects of the phase noise may be reduced to at most a specified, e.g. minimum, level or value. Since phase noise is a dominating portion of the noise during a single-channel VNA measurement, significant improvements in performance and accuracy may be achieved by using a common LO signal.

Figure 6:
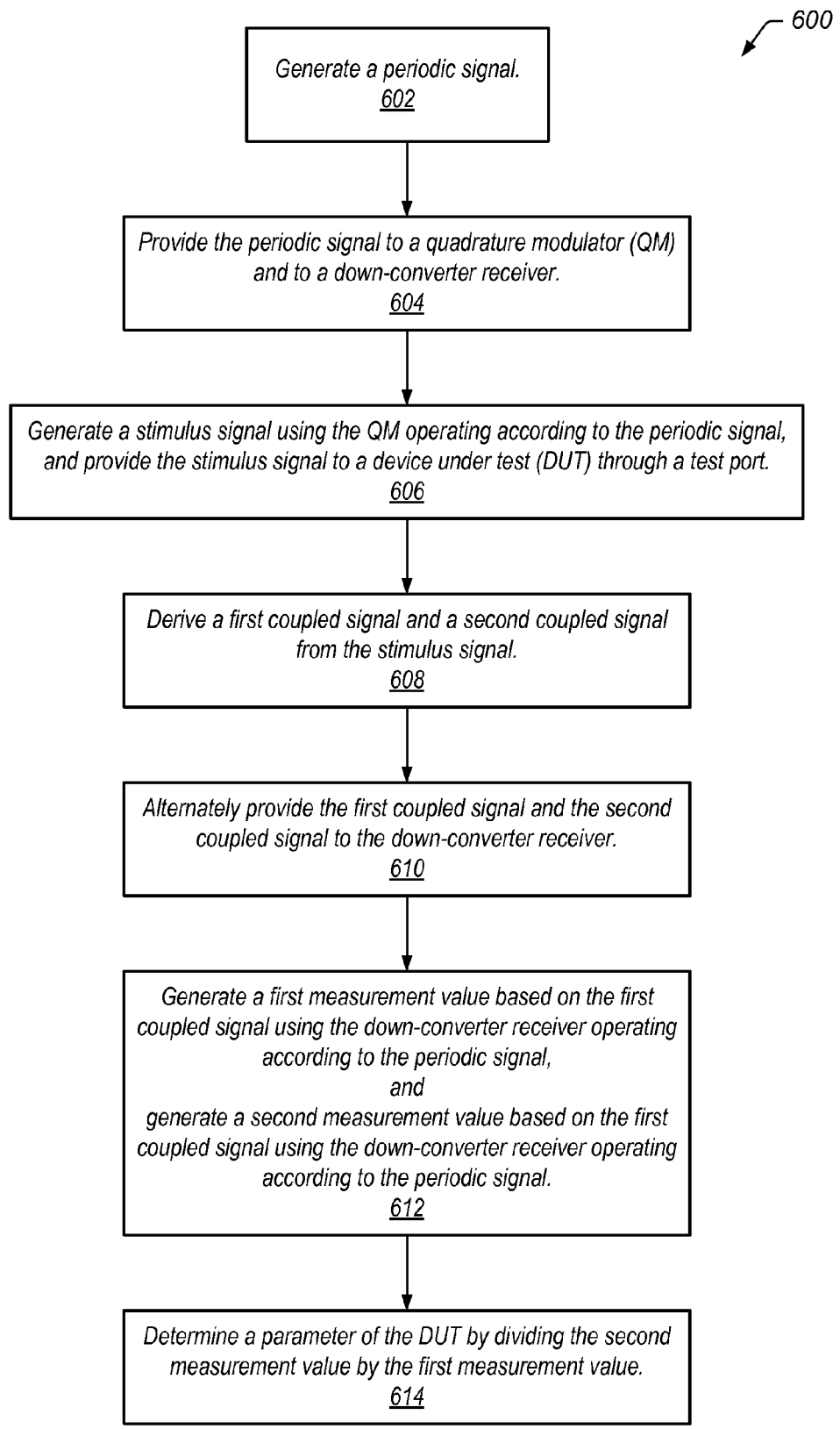
FIG. 6 shows a flow diagram illustrating one embodiment of a method for measuring parameters of a device under test.

A method may therefore be devised for using a single local oscillator signal for measuring parameters of a DUT. FIG. 6 shows a flow diagram 600 illustrating one embodiment of a method for measuring parameters of a DUT. According to flow diagram 600, a periodic signal is generated (602), and provided to a quadrature modulator (QM) and to a down converter receiver (604). A stimulus signal is then generated using the QM operating according to the periodic signal, and this stimulus signal is provided to the DUT (606). A first coupled signal and a second coupled signal are derived from the stimulus signal (608), and are alternately provided to the down converter receiver (610). A first measurement value based on the first coupled signal is then be generated using the down converter receiver operating according to the periodic signal, and a second measurement value based on the second coupled signal is also generated using the down converter receiver operating according to the periodic signal (612). A parameter of the DUT may then be determined by dividing the second measurement value with the first measurement value (614). In some embodiments, the first coupled signal may be derived by coupling at least a portion of a forward wave associated with the stimulus signal, and the second coupled signal may be derived by coupling at least a portion of a reverse wave associated with the stimulus signal. Accordingly the first coupled signal may be representative of incident power on the test port, while the second coupled signal may be representative of reflected power on the test port.

As previously mentioned, the use of a shared LO signal provides a far more effective measurement method than the common method of using a phase-locked reference or time-base (typically 10 MHz or 100 MHz). In case of the phase-locked reference, the stimulus signal and the receiver utilize separate LOs that are locked to the same time-base, providing accurate frequency settings and phase noise coherency within the bandwidths of the phase-locked loops, which are typically very low bandwidth (often <100 Hz). Therefore, most of the measurement bandwidth is uncorrelated, resulting in large deviations when making ratioed measurements. Reducing the noise during a single-channel vector measurement may be achieved by reducing the measurement bandwidth, effectively resulting in taking more averages of the noisy data, requiring more measurement time and slowing down the throughput of a test system. By using a shared LO, the noise is significantly reduced without having to increase the size of the captured data, and without requiring a change in the measurement bandwidth. The noise reduction provides the freedom to choose whether to make a ratio measurement at a greatly reduced variance compared to a traditional single-receiver VNA, or to reduce the sampled data size and perform the measurement at a much greater speed.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A measurement system comprising:
   a local oscillator configured to generate a periodic signal;
   a signal generator configured to receive the periodic signal, and generate a stimulus signal based on the received periodic signal;
   a test port configured to output a test signal based on the stimulus signal; and
   a receiver configured to:
      receive the periodic signal;
      alternately receive, as an input signal, a first coupled signal derived from the stimulus signal, and a second coupled signal derived from the stimulus signal;
      generate an output signal based on the received input signal according to the periodic signal.

2. The measurement system of claim 1, wherein the first coupled signal is representative of power incident on the test port, and wherein the second coupled signal is representative of power reflected on the test port.

3. The measurement system of claim 1, further comprising:
   a switching element comprising:
      a first input configured to receive the first coupled signal;
      a second input configured to receive the second coupled signal; and
      an output coupled to an input of the receiver;
   wherein the switching element is configured to controllably alternate between providing the first coupled signal to the input of the receiver and providing the second coupled signal to the input of the receiver.

4. The measurement system of claim 1, wherein the receiver is an I/Q down-converter receiver.

5. The measurement system of claim 1, wherein the signal generator comprises:
a quadrature modulator (QM) configured to receive a pair of modulator input signals and the periodic signal, and generate the stimulus signal based on the pair of modulator input signals and the periodic signal.

6. The measurement system of claim 5, wherein the QM is configured to provide an offset used for an intermediate frequency.

7. The measurement system of claim 1, further comprising:
an analog-to-digital converter coupled to an output of the receiver, and configured to produce respective numeric values corresponding to the first output signal and the second output signal according to the output signal provided at the output of the receiver.

8. The measurement system of claim 1, further comprising:
a first and a second directional coupler;
wherein the first directional coupler is configured to receive the stimulus signal, couple a portion of a forward wave associated with the stimulus signal as the first signal, and transmit the stimulus signal to the second directional coupler; and
wherein the second directional coupler is configured to receive the stimulus signal transmitted by the first directional coupler, couple a portion of a reverse wave associated with the stimulus signal as the second signal, and transmit the stimulus signal as the test signal to the test port.

9. A method for measuring parameters of a device under test (DUT), the method comprising:
generating a periodic signal;
providing the periodic signal to a quadrature modulator (QM) and to a down-converter receiver;
generating a stimulus signal using the QM operating according to the periodic signal;
deriving a first coupled signal and a second coupled signal from the stimulus signal;
alternately providing the first coupled signal and the second coupled signal to the down-converter receiver;
generating a first measurement value based on the first coupled signal using the down-converter receiver operating according to the periodic signal; and
generating a second measurement value based on the second coupled signal using the down-converter receiver operating according to the periodic signal.

10. The method of claim 9, wherein said deriving the first coupled signal comprises coupling at least a portion of a forward wave associated with the stimulus signal, and wherein said deriving the second coupled signal comprises coupling at least a portion of a reverse wave associated with the stimulus signal.

11. The method of claim 9, further comprising:
providing the stimulus signal to a DUT through a test port; and
determining a parameter of the DUT by dividing the second measurement value with the first measurement value.

12. The method of claim 9, further comprising providing the stimulus signal to a DUT through a test port;
wherein the first coupled signal is representative of incident power on the test port; and
wherein the second coupled signal is representative of reflected power on the test port.

13. A vector network analyzer (VNA) comprising:
a quadrature modulator (QM) configured to receive a local oscillator (LO) signal, and generate a stimulus signal according to the LO signal;
a signal coupling device configured to receive the stimulus signal and derive a first coupled signal and a second coupled signal from the stimulus signal;
a down-converter receiver configured to:
receive the LO signal;
alternately receive the first coupled signal and the second coupled signal as an input signal; and
generate a measurement signal based on the received input signal according to the LO signal.

14. The VNA of claim 13, further comprising a test port configured to:
receive the stimulus signal from the signal coupling device; and
couple to a device under test (DUT) to deliver the stimulus signal to the DUT.

15. The VNA of claim 14, wherein the first coupled signal is representative of incident power on the test port, and wherein the second coupled signal is representative of power reflected on the test port from the DUT.

16. The VNA of claim 13, further comprising:
a local oscillator configured to generate the LO signal.

17. The VNA of claim 13, further comprising a converter circuit configured to receive the measurement signal from the down-converter receiver, and generate a measurement value corresponding to the measurement signal.

18. The VNA of claim 13, wherein the QM is configured to provide an offset used for an intermediate frequency.

19. The VNA of claim 13, further comprising a switching circuit having:
a first input coupled to the signal coupling device to receive the first coupled signal;
a second input coupled to the signal coupling device to receive the second coupled signal; and
an output coupled to an input of the down-converter receiver;
wherein the switching device is configured to controllably establish connectivity between the first input and the output, and the second input and the output.

20. The VNA of claim 13, wherein the down-converter receiver is comprised in a spectrum analyzer (SA) circuit of the VNA.

21. The VNA of claim 20, wherein the SA circuit comprises a local oscillator configured to generate the LO signal.

* * * * *